(12) United States Patent
Tsai et al.

(10) Patent No.: US 11,038,496 B1
(45) Date of Patent: Jun. 15, 2021

(54) ISOLATOR AND SIGNAL GENERATION METHOD FOR IMPROVING COMMON MODE TRANSIENT IMMUNITY

(71) Applicant: INDUSTRIAL TECHNOLOGY RESEARCH INSTITUTE, Hsinchu (TW)

(72) Inventors: Hsuan-Yu Tsai, Taichung (TW); Yuan-Tai Chang, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/729,213

(22) Filed: Dec. 27, 2019

(30) Foreign Application Priority Data

Dec. 3, 2019 (TW) ................ 108144075

(51) Int. Cl.
*H03K 5/1252* (2006.01)
*H04L 25/02* (2006.01)
*H04B 1/10* (2006.01)

(52) U.S. Cl.
CPC .......... *H03K 5/1252* (2013.01); *H04B 1/10* (2013.01); *H04L 25/0266* (2013.01)

(58) Field of Classification Search
CPC .......... H03K 5/1252; H04B 1/10; H04B 1/08; H04L 25/0266
USPC ................................. 327/108–112
See application file for complete search history.

(56) References Cited

U.S. PATENT DOCUMENTS

| | | | |
|---|---|---|---|
| 5,408,499 A | * | 4/1995 | Sasaki ............... H03M 13/25 329/304 |
| 7,075,329 B2 | | 7/2006 | Chen et al. |
| 7,741,896 B2 | | 6/2010 | Chow et al. |
| 9,450,651 B2 | | 9/2016 | Subramoniam et al. |
| 9,548,710 B2 | | 1/2017 | Candage |
| 9,660,848 B2 | | 5/2017 | Yun et al. |

(Continued)

FOREIGN PATENT DOCUMENTS

| | | |
|---|---|---|
| CN | 104852556 A | 8/2015 |
| TW | 200603637 A | 1/2006 |

(Continued)

OTHER PUBLICATIONS

Hackel et al., "Capacitive Gate Drive Signal Transmission with Transient Immunity up to 300 V/ns", ITG-Fachbericht 266: Analog 2016, Sep. 12-14, 2016, pp. 53-57.

(Continued)

*Primary Examiner* — John W Poos
(74) *Attorney, Agent, or Firm* — Birch, Stewart, Kolasch & Birch, LLP

(57) ABSTRACT

The present invention discloses an isolator and a signal generation method. The isolator includes an input-side circuit, an output-side circuit and a signal transmission unit. The input-side circuit is configured to receive an input signal and to generate an encoding signal according to the input signal. The signal transmission unit is coupled to the input-side circuit and configured to receive and transmit the encoding signal. The output-side circuit is coupled to the signal transmission unit and configured to receive the encoding signal from the signal transmission unit. The encoding signal includes a first portion and a second portion. The first portion is a pulse signal, and the second portion is a non-amplitude encoding signal.

22 Claims, 7 Drawing Sheets

(56) References Cited

U.S. PATENT DOCUMENTS

| | | | |
|---|---|---|---|
| 9,685,923 | B2 | 6/2017 | Candage et al. |
| 9,698,728 | B2 | 7/2017 | Kamath et al. |
| 9,960,671 | B2 | 5/2018 | Ho et al. |
| 10,193,581 | B2 | 1/2019 | Ragonese et al. |
| 10,205,442 | B2 | 2/2019 | Lynch et al. |
| 10,686,547 | B1 * | 6/2020 | Li .......................... H04L 47/10 |
| 2008/0097763 | A1 | 4/2008 | Van De Par et al. |
| 2012/0303362 | A1 | 11/2012 | Duni et al. |
| 2016/0277048 | A1 | 9/2016 | Kramer et al. |
| 2017/0201399 | A1 | 7/2017 | Adinarayana et al. |
| 2018/0323746 | A1 | 11/2018 | Kamath et al. |
| 2019/0068410 | A1 | 2/2019 | Al-Shyoukh et al. |
| 2019/0207786 | A1 | 7/2019 | Sankaran et al. |

FOREIGN PATENT DOCUMENTS

| | | |
|---|---|---|
| TW | 201419649 A | 5/2014 |
| TW | 201523590 A | 6/2015 |

OTHER PUBLICATIONS

KE et al., "A 3-to-40V $V_{IN}$ 10-to-50MHz 12W Isolated GaN Driver with Self-Excited $t_{dead}$ Minimizer Achieving 0.2ns/0.3ns $t_{dead}$, 7.9% Minimum Duty Ratio and 50V/ns CMTI", 2018 IEEE International Solid-State Circuits Conference, Feb. 14, 2018, pp. 386-388.

Mallia et al., "A Self-Powered 50-Mb/s OOK Transmitter for Optoisolator LED Emulation", IEEE Journal of Solid-State Circuits, vol. 52, No. 3, Mar. 2017, pp. 678-687.

Mauerer et al., "Low-Jitter GaN E-HEMT Gate Driver With High Common-Mode Voltage Transient Immunity", IEEE Transactions on Industrial Electronics, vol. 64, No. 11, Nov. 2017, pp. 9043-9051.

Rouger et al., "CMOS gate drivers with integrated optical interfaces for extremely fast power transistors", 2016 IEEE, 2016, 6 pages.

Yun et al., "A Transformer-based Digital Isolator With $20kV_{PK}$ Surge Capability and > 200kV/µS Common Mode Transient Immunity", 2016 Symposium on VLSI Circuits Digest of Technical Papers, 2016, pp. 1-2.

\* cited by examiner

ISOLATOR AND SIGNAL GENERATION METHOD FOR IMPROVING COMMON MODE TRANSIENT IMMUNITY

This application claims the benefit of Taiwan application Serial No. 108144075, filed Dec. 3, 2019, the disclosure of which is incorporated by reference herein in its entirety.

TECHNICAL FIELD

The disclosure relates in general to an isolator and a signal generation method for improving common mode transient immunity.

BACKGROUND

Some electronic devices include both the circuits that can withstand high voltage and the circuits that cannot. To avoid the circuits that cannot withstand high voltage being damaged by a high voltage, the two types of circuits are separated by an isolator. In the electronic devices which require an isolator, common-mode transient interference is one among the key factors that cause error in signal transmission. The capacity against the interference is common mode transient immunity (CMTI) normally represented in the unit of V/ns or kV/us. The CMTI value means the resistance of the isolator against the noise occurring between the input side and the output side of the isolator. Generally speaking, the higher the level of precision of the electronic device is, the larger the CMTI value is needed. For example, electric vehicles, motor driving devices and solar electronic devices all require a large CMTI value of the isolator. Therefore, it has become a prominent task for the industries to improve the common mode transient immunity of the isolator.

SUMMARY

According to one embodiment of the present invention, an isolator is disclosed. The isolator includes an input-side circuit, an output-side circuit and a signal transmission unit. The input-side circuit is configured to receive an input signal and to generate an encoded signal according to the input signal. The signal transmission unit is coupled to the input-side circuit and configured to receive and transmit the encoded signal. The output-side circuit is coupled to the signal transmission unit and configured to receive the encoded signal from the signal transmission unit. The encoded signal includes a first portion and a second portion. The first portion is a pulse signal, and the second portion is a non-amplitude encoding signal.

According to another embodiment of the present invention, a signal generation method for an isolator is disclosed. The signal generation method includes: generating a first signal by a first encoder of an input-side circuit of the isolator according to an input signal; generating a second signal by a second encoder of the isolator according to the input signal and the first signal; and generating an encoded signal by a signal combine unit of the isolator according to the first signal and the second signal respectively, wherein the first signal and the second signal respectively correspond to a first portion and a second portion of the encoded signal, the first portion of the encoded signal is a pulse signal, and the second portion is a non-amplitude encoding signal.

The above and other aspects of the invention will become better understood with regard to the following detailed description of the preferred but non-limiting embodiment (s). The following description is made with reference to the accompanying drawings.

Figure 1:
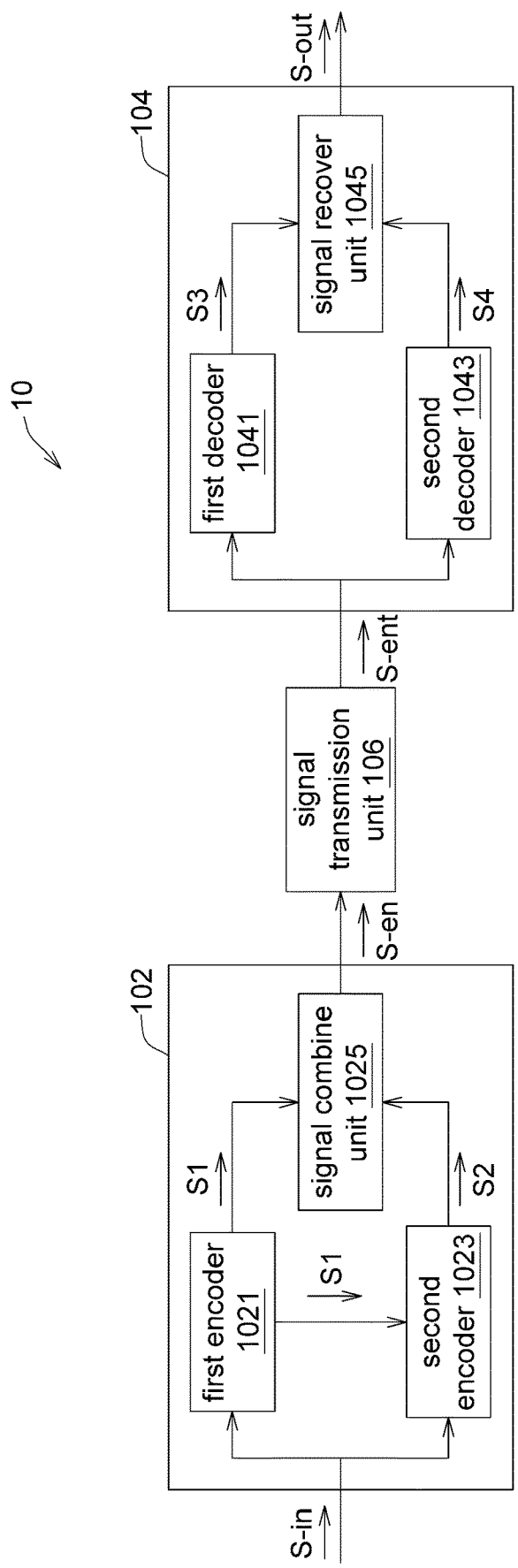
FIG. 1 is a block diagram of an isolator according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a block diagram of an isolator according to an embodiment of the present invention is shown. The isolator 10 includes an input-side circuit 102, an output-side circuit 104 and a signal transmission unit 106. The signal transmission unit 106 is coupled to the input-side circuit 102 and the output-side circuit 104. The signal transmission unit 106 electrically isolates the input-side circuit 102 and the output-side circuit 104. The input-side circuit 102 is configured to receive an input signal and encode the input signal S-in as an encoded signal S-en. The signal transmission unit transmits the encoded signal S-en to the output-side circuit 104 as a transmitted encoded signal S-ent. The output-side circuit 104 is configured to receive and decode the transmitted encoded signal S-ent as an output signal S-out.

In an embodiment, the input-side circuit 102 can be coupled to a first circuit (not illustrated), and the output-side circuit 104 can be coupled to a second circuit (not illustrated), wherein the voltage that the first circuit can withstand is lower than the voltage that the second circuit can withstand. To avoid the voltage used in the second circuit causing damage to the first circuit, the isolator 10 transmits the signal and isolates the first circuit and the second circuit. For example, in a motor, the first circuit can be a control circuit which generates a control signal for controlling the rotation speed of the motor, and the second circuit can be a driving circuit which drives the motor to rotate according to the control signal.

The input-side circuit 102 includes a first encoder 1021, a second encoder 1023 and a signal combine unit 1025. In an embodiment, the input signal S-in is a pulse width modulation (PWM) signal. The first encoder 1021 is configured to receive the input signal S-in. The first encoder 1021 detects a signal edge of the input signal S-in and generates a first signal S1 according to the signal edge of the input signal S-in. The first signal S1 can be a pulse signal. The second encoder 1023 is coupled to the first encoder 1021 and configured to generate a second signal S2 according to the input signal S-in and the first signal S1. The second signal S2 can be a non-amplitude encoding signal, such as a frequency encoding signal or a phase encoding signal. The signal combine unit 1025 is coupled to the first encoder 1021 and the second encoder 1023 and configured to combine the first signal S1 and the second signal S2 to generate an encoded signal S-en. The encoded signal S-en includes a first portion corresponding to the first signal S1 and a second portion corresponding to the second signal S2. In other words, the encoded signal S-en of the present embodiment may include the component of the pulse signal and the component of the non-amplitude encoding signal. The encoded signal S-en is transmitted to the output-side circuit 104 as a transmitted encoded signal S-ent from the input-side circuit 102 via signal transmission unit 106.

The output-side circuit 104 includes a first decoder 1041, a second decoder 1043 and a signal recover unit 1045. The first decoder 1041 is configured to extract the first portion of the transmitted encoded signal S-ent (that is, the component of the pulse signal) and to generate a third signal S3 according to the first portion of the transmitted encoded signal S-ent. The second decoder 1043 is configured to extract the second portion of the transmitted encoded signal S-ent and to generate a fourth signal S4 according to the second portion of the transmitted encoded signal S-ent. The signal recover unit 1045 generates an output signal S-out according to the third signal S3 and the fourth signal S4. Details are disclosed below.

Figure 2:
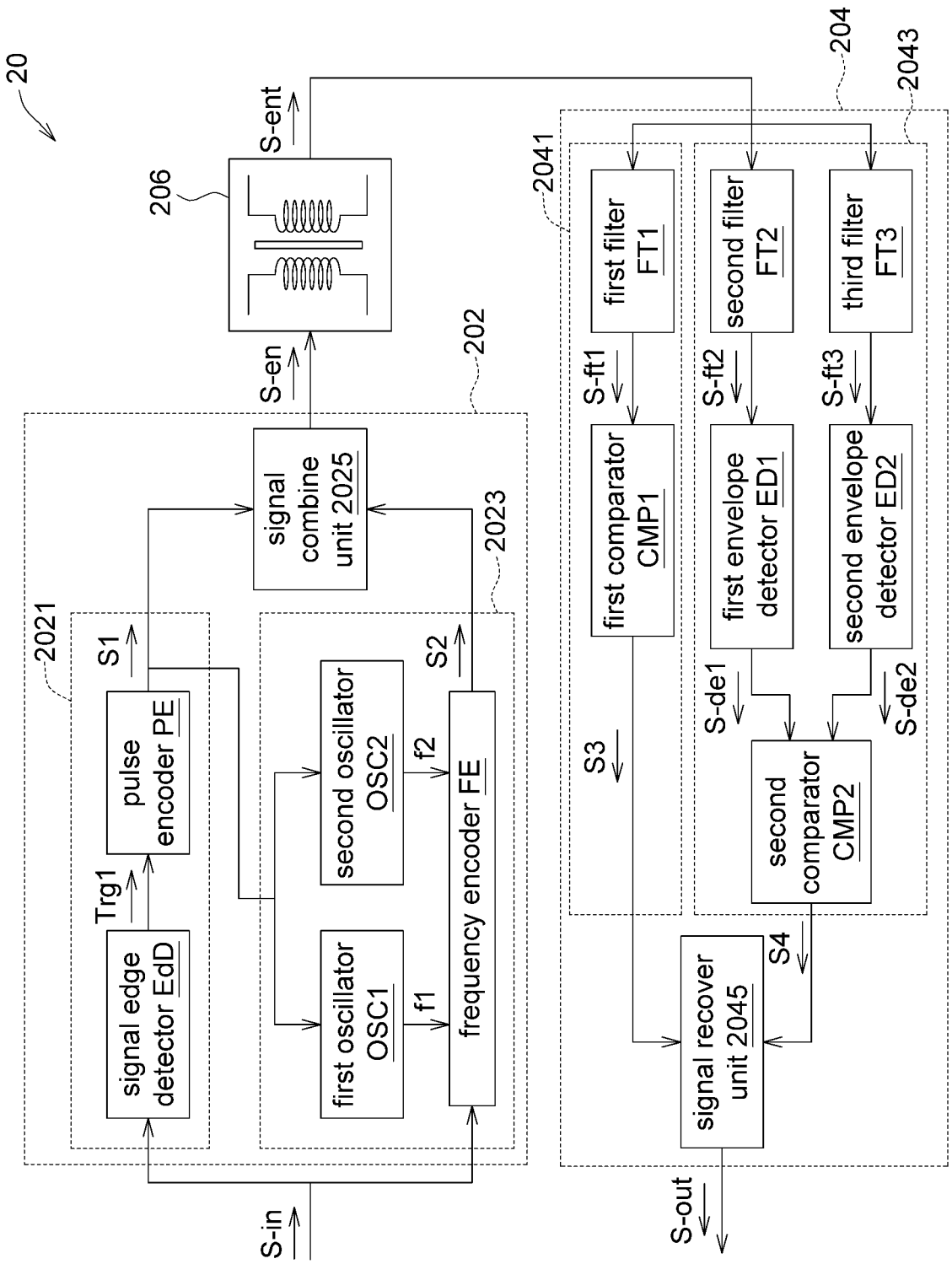
FIG. 2 is a block diagram of an isolator according to another embodiment of the present invention.

Referring to FIG. 2, a block diagram of an isolator according to another embodiment of the present invention is shown. FIG. 2 illustrates further details of the first encoder, the second encoder, the first decoder and the second decoder. The isolator 20 includes an input-side circuit 202, an output-side circuit 204 and a signal transmission unit 206. The input-side circuit 202 includes a first encoder 2021, a second encoder 2023 and a signal combine unit 2025. The output-side circuit 204 includes a first decoder 2041, a second decoder 2043 and a signal recover unit 2045.

The first encoder 2021 includes a signal edge detector EdD and a pulse encoder PE. In the present embodiment, the signal edge detector EdD, when detecting the rising edge and the falling edge of the input signal S-in, transmits an activating signal Trg1 to the pulse encoder PE. The pulse encoder PE generates a first signal S1 according to the activating signal Trg1. In the present embodiment, the first signal S1 generated by the rising edge corresponding to the input signal S-in is identical to the first signal S1 generated by the falling edge corresponding to the input signal S-in. In an actual example, the first signal S1 generated by the rising edge corresponding to the input signal S-in is a positive pulse, and the first signal S1 generated by the falling edge corresponding to the input signal S-in also is a positive pulse.

The second encoder 2023 includes a first oscillator OSC1, a second oscillator OSC2 and a frequency encoder FE. The first oscillator OSC1 and the second oscillator OSC2 are configured to receive the first signal S1, and start to oscillate when activated by the first signal S1. The first oscillator OSC1 outputs the first oscillating signal f1 whose oscillating frequency is the first frequency, and the second oscillator OSC2 outputs the second oscillating signal f2 whose oscillating frequency is the second frequency. The frequency encoder FE is coupled to the first oscillator OSC1 and the second oscillator OSC2. In an embodiment, after the first oscillator OSC1 and the second oscillator OSC2 are activated by the first signal S1, the first oscillator OSC1 and the second oscillator OSC2 will oscillate for a predetermined time and then stop to save power consumption. For example, the predetermined time can be determined according to the following setting: the duration of the first oscillating signal f1 can be less than or equal to the duration at which the input signal maintains at a high level, and the duration of the second oscillating signal f2 can be less than or equal to the duration at which the input signal maintains at a low level. The frequency encoder FE is configured to receive the input signal S-in and determine the level of the input signal S-in; if the input signal S-in is at a high level, then the input signal S-in is encoded by the first oscillating signal f1 with the first frequency; if the input signal S-in is at a low level, then the input signal S-in is encoded by the second oscillating signal f2 with the second frequency, and the encoded signal is outputted as the second signal S2.

The signal combine unit 2025 is configured to combine the first signal S1 and the second signal S2 to generate the encoded signal S-en. The signal combine unit 2025 can be a direct coupling circuit, a capacitive coupling circuit, or a simple combinational circuits.

In an embodiment, the signal combine unit 2025 is a direct coupling circuit, which receives the first signal S1 and the second signal S2, adds the first signal S1 and the second signal S2 and generates the encoded signal S-en.

In another embodiment, the signal combine unit 2025 is a capacitive coupling circuit, which includes a capacitor. A first end and a second end of the capacitor respectively receive the first signal S1 and the second signal S2, and the capacitor generates the encoded signal S-en at the second end.

Figure 7:
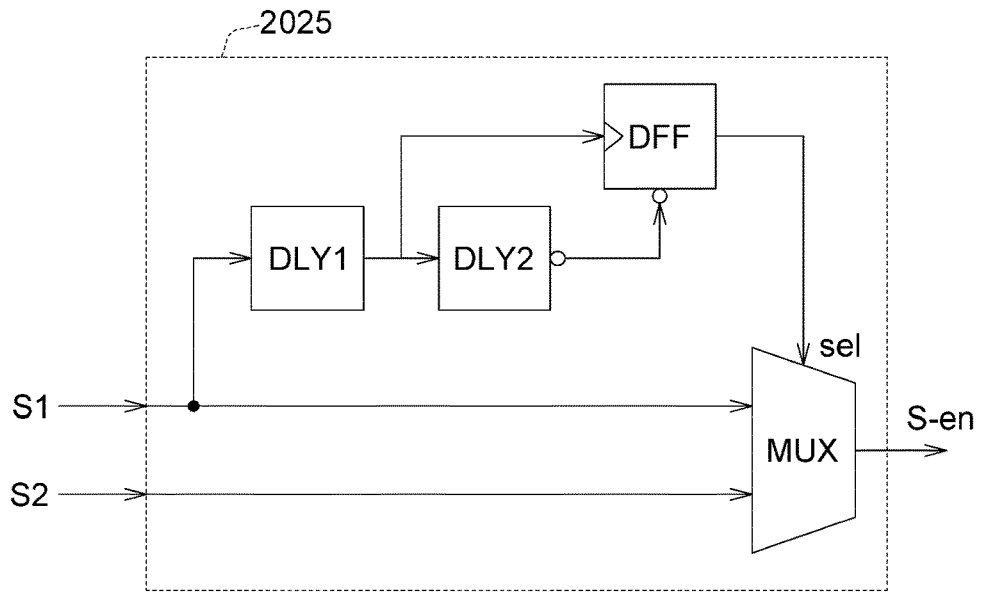
FIG. 7 is a block diagram of a signal combine unit according to an embodiment of the present invention.

In an alternate embodiment as indicated in FIG. 7, the signal combine unit 2025 may include a first delay circuit DLY1, a second delay circuit DLY2, a D-type flip-flop DFF and a multiplexer MUX. The first delay circuit DLY1 receives the first signal S1 and generates a delayed first signal (the trigger signal). The second delay circuit DLY2 receives the delayed first signal S1 and generates the RESET signal, which is delayed again and inverted. The D-type flip-flop DFF receives the trigger signal and the RESET signal, and generates a selection signal sel. The multiplexer MUX receives the first signal S1 and the second signal S2, and generates the encoded signal S-en according to the selection signal sel. If the selection signal sel is at a low level, then the multiplexer MUX outputs the first signal S1 as the encoded signal; if selection signal sel is at a high level, then the multiplexer MUX outputs the second signal S2 as the encoded signal S-en.

In the input-side circuit 202, the first signal S1 generated by the first encoder 2021 according to the signal edge of the input signal S-in is used as a signal for awakening the first oscillator OSC1 and the second oscillator OSC2 of the second encoder 2023 and for causing the second encoder 2023 to generate the second signal S2 immediately after the first signal S1 is generated. Thus, the signal combine unit 2025 can simply combine the first signal S1 and the second signal S2 as the encoded signal S-en without adjusting the timing sequence of the first signal S1 and the second signal S2.

Figure 3A:
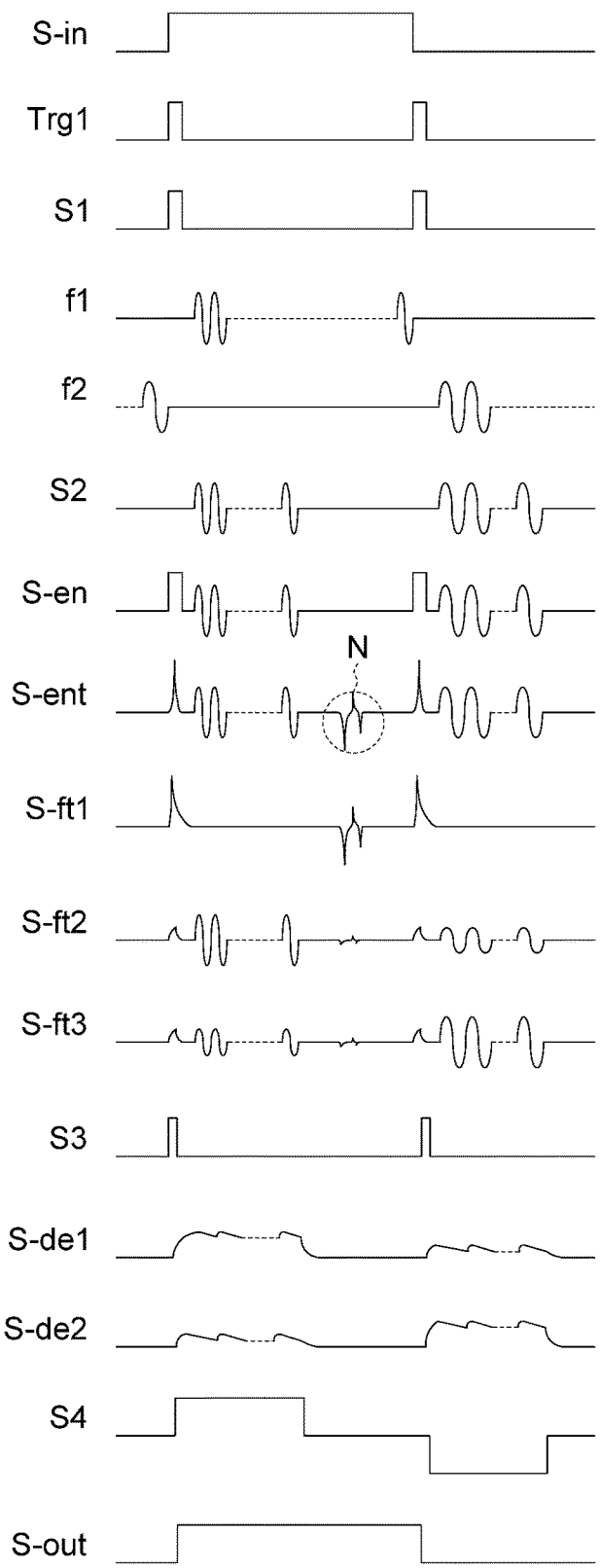
FIG. 3A is a schematic diagram of the signal waveform of an isolator according to an embodiment of the present invention.

As indicated in the waveform diagram of FIG. 3A, the rising edge of the input signal S-in will be encoded as a frequency encoding signal with the first frequency following a positive pulse signal, and the falling edge of the input signal S-in will be encoded as a frequency encoding signal with the second frequency following a positive pulse signal. In other words, the output-side circuit 204 can determine whether the received signal represents the rising edge or the falling edge according to whether the frequency is the first frequency or the second frequency.

Refer to FIG. 2. The first decoder 2041 includes a first filter FT1 and a first comparator CMP1. The first filter FT1 can be a high pass filter configured to output a first filtering signal S-ft1 according to the transmitted encoded signal S-ent. In the present embodiment, the first filter FT1 is configured to filter a low frequency component signal off the transmitted encoded signal S-ent to filter the first portion corresponding to the first signal S1 (that is, the pulse signal component), wherein the low frequency component signal includes the first oscillating signal and the second oscillating signal of the second portion corresponding to the second signal S2. The first comparator CMP1 out puts a third signal S3 according to the first filtered signal S-ft1. To put it in greater details, the first comparator CMP1 compares the first filtered signal S-ft1 with a first predetermined level: if the first filtered signal S-ft1 is not lower than the first predetermined level, then the outputted third signal S3 is at a high level; if the first filtered signal S-ft1 is less than the first predetermined level, then the outputted third signal S3 is at a low level.

The second decoder 2043 includes a second filter FT2, a third filter FT3, a first envelope detector ED1, a second envelope detector ED2 and a second comparator CMP2. The second filter FT2 is configured to output a second filtered signal S-ft2 according to the transmitted encoded signal S-ent. The second filter FT2 can be a band-pass filter, and the center frequency of the second filter FT2 can be the first frequency. The second filter FT2 filters the component of the second portion of the transmitted encoded signal S-ent that corresponds to the second signal S2 and has the first frequency, wherein the second portion refers to the frequency encoded signal. The first envelope detector ED1 is configured to detect the envelope of the second filtered signal S-ft2 and to output a first decoded signal S-de1 according to the second filtered signal S-ft2 (that is, to output the envelope of the second filtered signal S-ft2). The third filter FT3 is configured to output a third filtered signal S-ft3 according to the transmitted encoded signal S-ent. The third filter FT3 can be a band-pass filter, and the center frequency of the third filter FT3 can be the second frequency. The third filter FT3 filters the second portion of the transmitted encoded signal S-ent that corresponds to the second signal S2 and has the second frequency, wherein the second portion refers to the frequency encoded signal. The second envelope detector ED2 is configured to detect the envelope of the third filtered signal S-ft3 and to output a second decoded signal S-de2 according to the third filtered signal S-ft3 (that is, to output the envelope of the third filtered signal S-ft3). The second comparator CMP2 is configured to output the fourth signal S4 according to the first decoded signal S-de1 and the second decoded signal S-de2. To put it in greater details, the second comparator CMP2 can be a tri-state comparator, which compares a third decoded signal with a second predetermined level and the third predetermined level, wherein the third decoded signal is obtained from the difference of the first decoded signal S-de1 and the second decoded signal S-de2. If the third decoded signal is not lower than the second predetermined level, then the outputted fourth signal is at a high level; if the third decoded signal is not greater than the third predetermined level, then the outputted fourth signal is at a low level; if the third decoded signal is less than the second predetermined level and greater than the third predetermined level, then the outputted fourth signal is at a tri-state level (such as the level of the common mode or 0). The signal recover unit 2045 is configured to generate an output signal S-out according to the third signal S3 and the fourth signal S4. The signal recover unit 2045 determines a time point of conversion of the output signal S-out according to the third signal S3. The signal recover unit 2045 may include a multiplication circuit and a judgment circuit. The multiplication circuit multiplies the third signal S3 with the fourth signal S4. In the embodiment of FIG. 3A, the judgment circuit determines the level of the output signal S-out according to the product of the third signal S3 and the fourth signal S4. To put it in greater details: if the product of the third signal S3 and the fourth signal S4 is greater than 0, then the output signal S-out is converted to a high level from a low level; if the product of the third signal S3 and the fourth signal S4 is less than 0, then the output signal S-out is converted to a low level from a high level; if the product of the third signal S3 and the fourth signal S4 is equal to 0, then the output signal S-out is not converted (that is, maintains at the current level). In other words, in the present embodiment, apart from determining the position of the signal edge of the output signal S-out (determining the time point at which the high level and the low level are converted), the third signal S3 together with the fourth signal S4 further determine whether the output signal S-out is at a high level, a low level or maintains the current level. In other words, the fourth signal S4 can help the signal recover unit 2045 to determine whether the third signal S3 is generated by the encoded signal or caused by the noises arising during the transmission of the encoded signal, such that signal decoding can be less affected by noises.

Figure 3B:
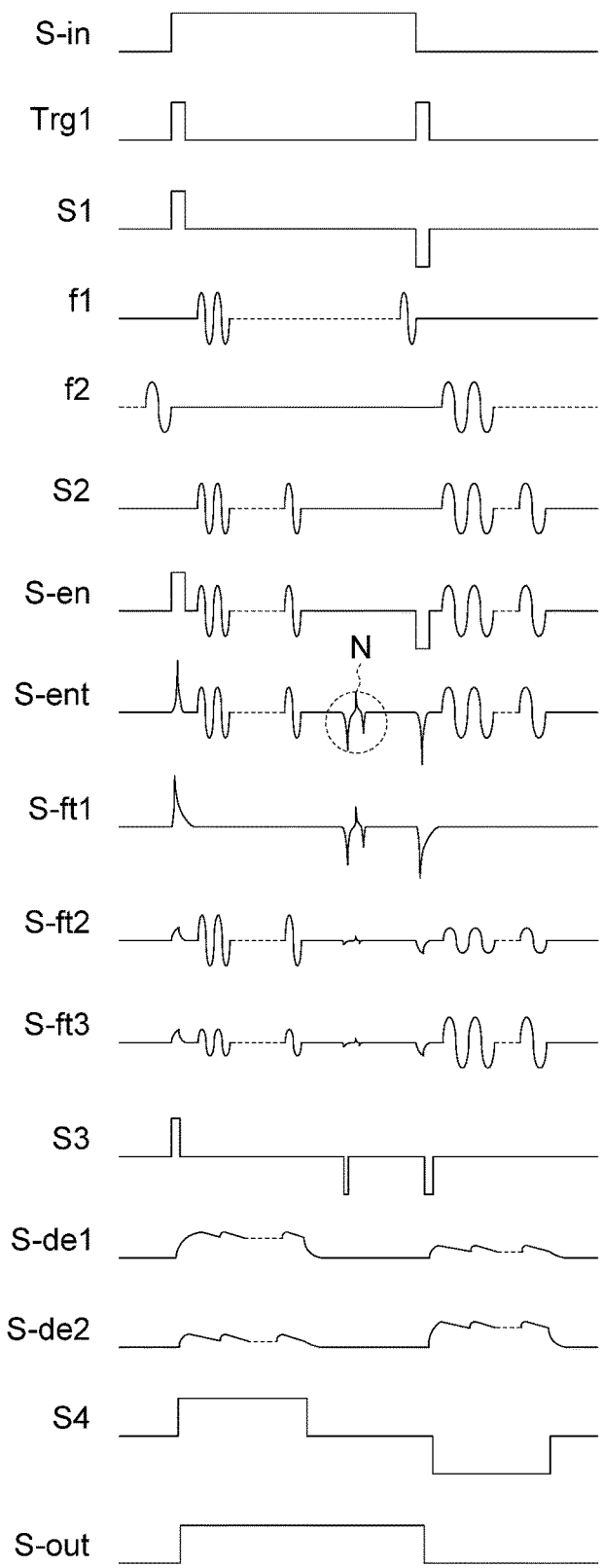
FIG. 3B is a schematic diagram of the signal waveform of an isolator according to another embodiment of the present invention.

In an alternate embodiment, the first signal S1 corresponding to the rising edge of the input signal S-in is different from the first signal S1 corresponding to the falling edge of the input signal S-in. In an actual example, the first signal S1 corresponding to the rising edge of the input signal S-in is a positive pulse, and the first signal S1 corresponding to the falling edge of the input signal S-in is a negative pulse. As indicated in the waveform diagram of FIG. 3B, the rising edge of the input signal S-in will be encoded as a frequency encoded signal with the first frequency following a positive pulse signal, and the falling edge of the input signal S-in will be encoded as a frequency encoded signal with the second frequency following a negative pulse signal. In the embodiment of FIG. 3B, the first comparator CMP1 compares the level of the first filtered signal S-ft1 with a fourth predetermined level and a fifth predetermined level: if the first filtered signal S-ft1 is not less than the fourth predetermined level, then the outputted third signal S3 is the first level (such as high level); if the first filtered signal S-ft1 is not greater than the fifth predetermined level, then the outputted third signal S3 is the second level (such as low level); if the first filtered signal S-ft1 is greater than the fifth predetermined level and less than the fourth predetermined level, then the outputted third signal S3 is the third level (such as the level of the common mode or 0). The judgment circuit of the signal recover unit 2045 determines the level of the outputted output signal S-out according to the value of the third signal S3 and the value of the fourth signal S4 in addition to the product of the third signal S3 and the fourth signal S4. To put it in greater details: if the product of the third signal S3 and the fourth signal S4 is greater than 0 and both values of the third signal S3 and the fourth signal S4 are greater than 0, then the output signal S-out is converted to a high level from a low level; if the product of the third signal S3 and the fourth signal S4 is greater than 0 and both values of the third signal S3 and the fourth signal S4 are less than 0, then the output signal S-out is converted to a low level from a high level; if the product of the third signal S3 and the fourth signal S4 is less than or equal to 0, then the output signal S-out is not converted (that is, maintains at the current level).

Figure 4:
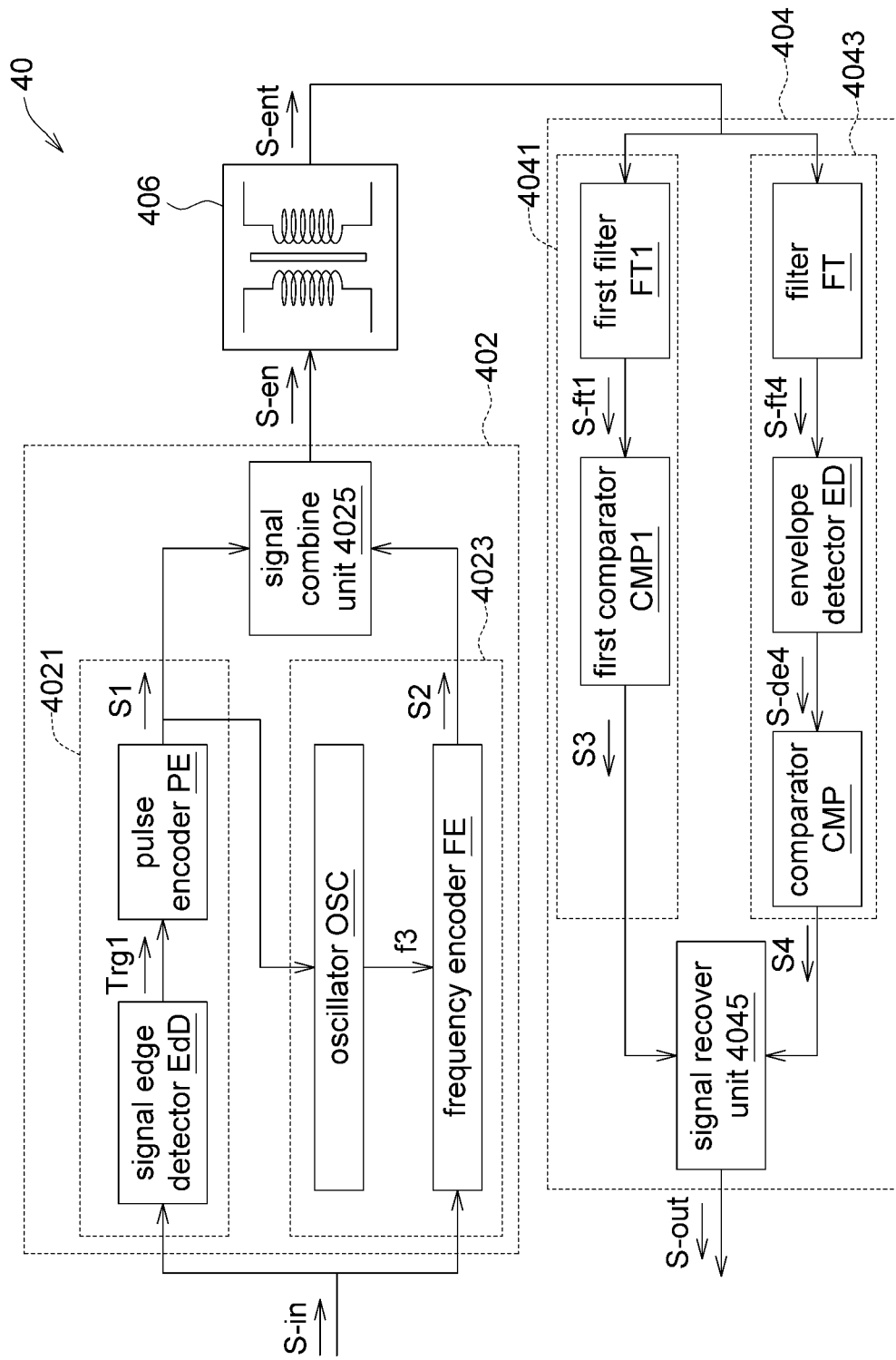
FIG. 4 is a block diagram of an isolator according to the present invention an alternate embodiment.

Referring to FIG. 4, a block diagram of an isolator according to the present invention an alternate embodiment is shown. FIG. 4 illustrates further details of the first encoder, the second encoder, the first decoder and the second decoder. The isolator 40 includes an input-side circuit 402, an output-side circuit 404 and a signal transmission unit 406. The input-side circuit 402 includes a first encoder 4021, a second encoder 4023 and a signal combine unit 4025. The output-side circuit 404 includes a first decoder 4041, a second decoder 4043 and a signal recover unit 4045.

The first encoder 4021 includes a signal edge detector EdD and a pulse encoder PE. In the present embodiment, when the signal edge detector EdD detects a first activating signal Trg1 generated by the signal edge of the input signal S-in, the first signal S1 generated by the pulse encoder PE in response to the first activating signal Trg1 is a positive pulse, the first signal S1 generated by the pulse encoder PE in response to the second activating signal Trg1 is a negative pulse, and the rest can be obtained by the same analogy.

The second encoder 4023 includes an oscillator OSC and a frequency encoder FE. The oscillator OSC outputs the third oscillating signal f3 whose oscillating frequency is the third frequency. The oscillator OSC starts to oscillate when activated by the first signal S1. The frequency encoder FE is configured to receive the input signal S-in and encode the third frequency f3 as the input signal S-in, which is outputted as the second signal S2.

Like the signal combine unit 2023, the signal combine unit 4025 combines the first signal S1 and the second signal S2 to generate the encoded signal S-en.

That is, in the input-side circuit 402, the first encoder 4021 generated by the first signal S1 according to the signal edge of the input signal S-in is used as a signal for awakening the oscillator OSC of the second encoder 4023 and for causing the second encoder 4023 to generate the second signal S2 immediately after the first signal S1 is generated. Thus, the signal combine unit 4025 can simply combine the first signal S1 and the second signal S2 without adjusting the timing sequence of the first signal S1 and the second signal S2.

Figure 5:
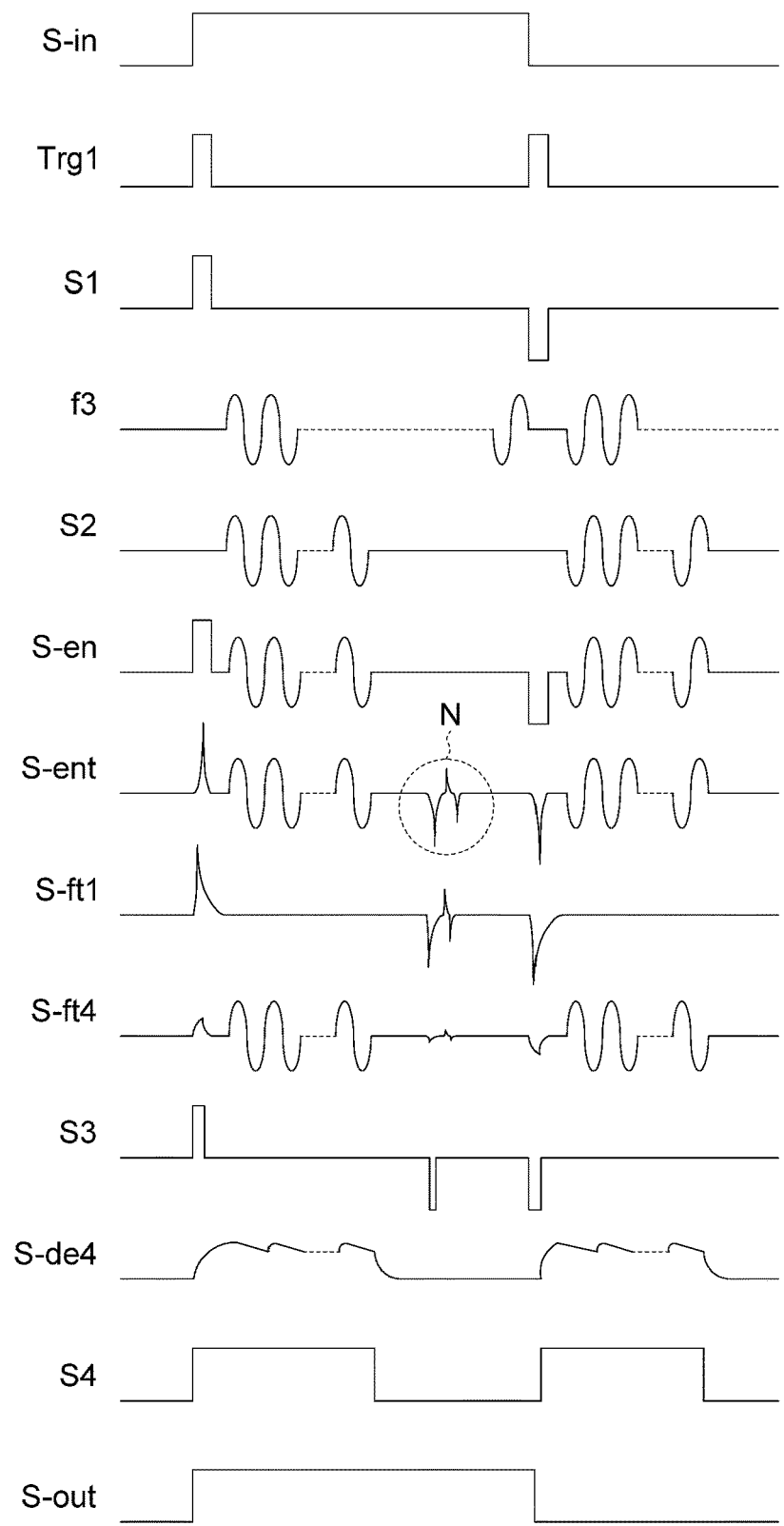
FIG. 5 is a schematic diagram of the signal waveform of an isolator according to the present invention an alternate embodiment.

FIG. 5 is a diagram of the signal waveform of an isolator 40 according to the present invention an alternate embodiment. FIG. 5 further illustrates the relation between the input signal S-in and the encoded signal S-en. The rising edge of the input signal S-in will be encoded as a frequency encoding signal with a third frequency f3 following a positive pulse signal, and the falling edge of the input signal S-in will be encoded as a frequency encoding signal with a third frequency f3 following a negative pulse signal. In other words, the output-side circuit 404 determines whether the received signal represents the rising edge or the falling edge according to whether the pulse signal is positive or negative.

Refer to FIG. 4. The first decoder 4041 includes a first filter FT1 and a first comparator CMP1. In the present embodiment, the first filter FT1 filters a low frequency component signal off the transmitted encoded signal S-ent to filter the first portion corresponding to the first signal S1 (that is, the pulse signal component), wherein the low frequency component signal includes the oscillating signal of the second portion corresponding to the second signal S2. The first comparator CMP1 compares the first filtered signal S-ft1 with a sixth predetermined level and a seventh predetermined level: if the first filtered signal S-ft1 is not less than the sixth predetermined level, then the outputted third signal S3 is the first level (such as high level); if the first filtered signal S-ft1 is not greater than the seventh predetermined level, then the outputted third signal S3 is the second level (such as low level); if the first filtered signal S-ft1 is greater than the seventh predetermined level and less than the sixth predetermined level, then the outputted third signal S3 is the third level (such as the level of the common mode or 0).

The second decoder 4043 includes a filter FT, an envelope detector ED and a comparator CMP. The center frequency of the filter FT is the third frequency. The filter FT is configured to filter the second portion of the transmitted encoded signal S-ent corresponding to the second signal S2 (the frequency encoding component) to output a fourth filtered signal S-ft4. The envelope detector ED detects the envelope of the fourth filtered signal S-ft4 and outputs the fourth decoded signal S-de4. The comparator CMP compares the fourth decoded signal S-de4 with an eighth predetermined level: if the fourth decoded signal S-de4 is not less than the eighth predetermined level, then the outputted fourth signal S4 is at a high level; if the fourth decoded signal S-de4 is less than the eighth predetermined level, then the outputted fourth signal S4 is at a low level. The signal recover unit 4045 generates an output signal S-out according to the third signal S3 and the fourth signal S4. For example, the signal recover unit 2045 determines a time point of conversion of the output signal S-out signal according to the third signal S3, and the conversion type of the output signal S-out at the time point of conversion is determined according to the product of the third signal S3 and the fourth signal S4. To put it in greater details: if the product of the third signal S3 and the fourth signal S4 is greater than 0, then the output signal S-out is converted to a high level from a low level; if the product of the third signal S3 and the fourth signal S4 is less than 0, then the output signal S-out is converted to a low level from a high level; if the product of the third signal S3 and the fourth signal S4 is equal to 0, then the output signal S-out is not converted (that is, maintains at the current level).

In the present embodiment, the third signal S3 is configured to determine the timing point of the signal edge of the output signal S-out. The third signal S3 together with the fourth signal S4 further determine whether the output signal S-out is at a high level, a low level or maintains the current level. That is, the fourth signal S4 can help signal recover unit 4045 to confirm whether the third signal S3 is generated from the encoded signal or caused by the noises.

Detailed signal waveform of the isolator 40 can be obtained with reference to FIG. 5. Regardless of the examples of FIG. 3A, FIG. 3B or FIG. 5, the noises N generated during the transmission process cannot affect the waveform of the output signal S-out because the output signal S-out in the output-side circuits 204 and 404 is determined by the third signal S3 and the fourth signal S4 together.

In the above embodiments, the signal transmission unit is exemplified by induction coils. In other embodiments, the signal transmission unit can also be realized by a signal transmission device such as an optocoupler or a charge coupler, and is not subjected to specific restrictions in the present invention.

Figure 6:
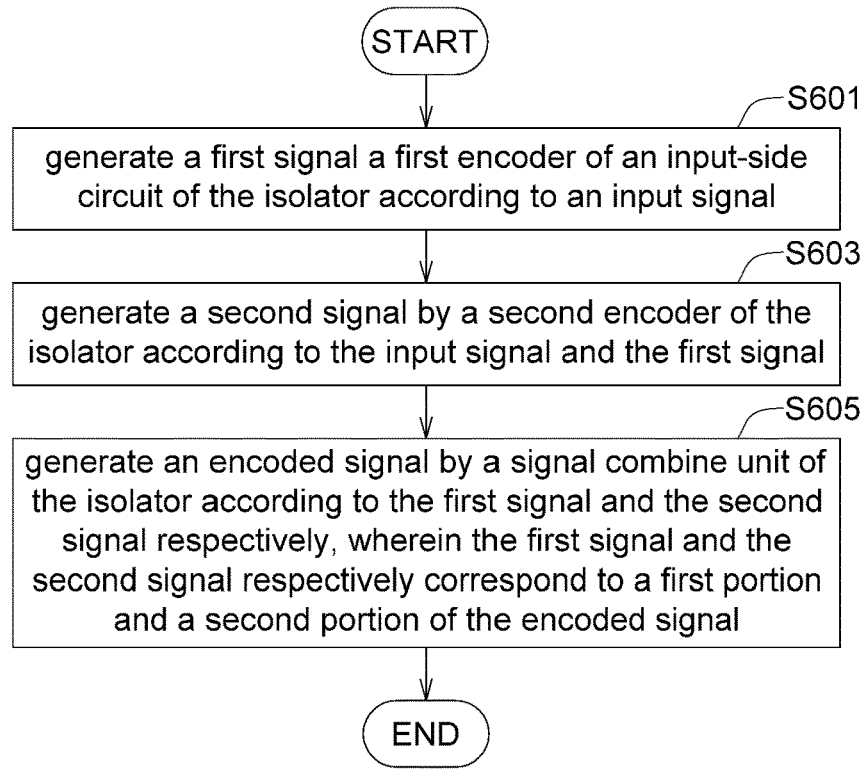
FIG. 6 is a flowchart of a signal generation method according to an embodiment of the present invention.

The present invention also provides a signal generation method for the isolator. Referring to FIG. 6, the signal generation method includes S601~S605.

In S601, a first signal is generated by a first encoder of an input-side circuit of the isolator according to an input signal.

S603, a second signal is generated by a second encoder of the isolator according to the input signal and the first signal.

S605, an encoded signal is generated by a signal combine unit of the isolator according to the first signal and the second signal respectively, wherein the first signal and the second signal respectively correspond to a first portion and a second portion of the encoded signal, the first portion is a pulse signal, and the second portion is a non-amplitude encoding signal.

Further details of the signal generation method can be obtained with reference to the above embodiments, and are not repeated here.

Through circuit design, two types of encoding operations are integrated, such that the isolator of the present invention advantageously possesses the features of low circuit complexity, accurate positioning of signal edge and robust noise resistance, and helps to improve signal reliability of the isolator.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An isolator, comprising:
   an input-side circuit, comprising:
   a first encoder configured to receive an input signal and to generate a first signal according to the input signal;
   a second encoder configured to receive the input signal and the first signal and to generate a second signal according to the input signal and the first signal; and
   a signal combine unit configured to generate an encoded signal according to the first signal and the second signal, wherein the first signal and the second signal respectively correspond to a first portion and a second portion of the encoded signal;
   a signal transmission unit coupled to the input-side circuit and configured to receive and transmit the encoded signal; and
   an output-side circuit coupled to the signal transmission unit, wherein the output-side circuit comprises:
   a first decoder configured to receive a transmitted encoded signal from the signal transmission unit and to generate a third signal according to the transmitted encoding signal;
   a second decoder configured to receive the transmitted encoded signal and to generate a fourth signal according to the transmitted encoded signal; and
   a signal recover unit configured to generate an output signal according to the third signal and the fourth signal,
   wherein the first portion of the encoded signal is a pulse signal, the pulse signal is a positive pulse or a negative pulse, the positive pulse and the negative pulse indicate a signal edge of the input signal, and
   wherein the second portion is a non-amplitude encoding signal, and a central frequency of the first portion of the encoded signal is significantly higher than a central frequency of the second portion of the encoded signal.

2. The isolator according to claim 1, wherein,
   the first encoder further comprises:
   a signal edge detector configured to detect at least one signal edge of the input signal to output an activating signal corresponding to each signal edge; and
   a pulse encoder configured to generate the first signal in response to the at least one activating signal, wherein if the at least one signal edge is a rising edge or a falling edge, then the first signal is a positive pulse signal;
   the second encoder further comprises:
   a first oscillator configured to receive the first signal and generate a first oscillating signal with a first frequency;
   a second oscillator configured to receive the first signal and generate a second oscillating signal with a second frequency; and
   a frequency encoder configured to receive the input signal and detect the level of the input signal, wherein if the input signal is at a high level, then the frequency encoder generates the second signal according to the input signal and the first oscillating signal with the first frequency; if the input signal is at a low level, then the frequency encoder generates the second signal according to the input signal and the second oscillating signal with the second frequency.

3. The isolator according to claim 2, wherein,
   the first decoder further comprises:
   a first filter configured to receive the transmitted encoded signal and filter a low frequency component off the transmitted encoded signal, wherein the low frequency component signal comprises the first oscillating signal with the first frequency and the second oscillating signal with the second frequency for generating a first filtered signal; and
   a first comparator configured to receive and compare the first filtered signal with a predetermined level to generate the third signal, wherein if the first filtered signal is greater than the predetermined level, then the generated third signal is at a high level; if the first filtered signal is less than the predetermined level, then the generated third signal is at a low level;
   the second decoder further comprises:
   a second filter configured to receive the transmitted encoded signal and to filter the first oscillating signal with the first frequency to generate a second filtered signal;
   a first envelope detector configured to receive the second filtered signal and to generate a first decoded signal according to the envelope of the second filtered signal;
   a third filter configured to receive the transmitted encoded signal and to filter the second oscillating signal with the second frequency to generate a third filtered signal;
   a second envelope detector configured to receive the third filtered signal and to generate a second decoded signal according to the envelope of the third filtered signal; and
   a second comparator configured to receive the first decoded signal and the second decoded signal and to generate the fourth signal according to the difference of the first decoded signal and the second decoded signal.

4. The isolator according to claim 1, wherein the signal recover unit comprises:
  a multiplication circuit configured to receive the third signal and the fourth signal and multiply the third signal with the fourth signal; and
  a judgment circuit configured to generate the output signal according to a product of the third signal and the fourth signal, wherein if the product is greater than 0, then the generated output signal is converted to a high level; if the product is equal to 0, then the generated output signal does not change its state; if the product is less than 0, then the generated output signal is converted to a low level.

5. The isolator according to claim 1, wherein, the signal combine unit is a direct coupling circuit, which receives and adds the first signal and the second signal to generate the encoded signal.

6. The isolator according to claim 1, wherein, the signal combine unit is a capacitive coupling circuit, which comprises:
  a capacitor whose first end and second end respectively receive the first signal and the second signal, wherein the capacitive coupling circuit generates the encoded signal at the second end.

7. The isolator according to claim 1, wherein, the signal combine unit further comprises:
  a first delay circuit configured to receive the first signal and generate a trigger signal which is the delayed first signal;
  a second delay circuit configured to receive the delayed first signal and generate a reset signal which is delayed and inverted trigger signal;
  a Dtype flip-flop configured to receive a trigger signal and a reset signal, to generate a selection signal; and
  a multiplexer configured to receive the first signal and the second signal and to generate the encoded signal according to the selection signal, wherein if the selection signal is at a low level, then the multiplexer outputs the first signal as the encoded signal; if the selection signal is at a high level, then the multiplexer outputs the second signal as the encoded signal.

8. The isolator according to claim 2, wherein, the duration of the first oscillating signal generated by the first oscillator is less than or equal to the duration at which the input signal maintains at a high level, and the duration of the second oscillating signal generated by the second oscillator is less than or equal to the duration at which the input signal maintains at a low level.

9. The isolator according to claim 1, wherein,
  the first encoder further comprises:
    a signal edge detector configured to detect at least one signal edge of the input signal to output an activating signal corresponding to each signal edge; and
    a pulse encoder configured to generate the first signal in response to the at least one activating signal, wherein if the at least one signal edge is a rising edge, then the first signal is a positive pulse; if the at least one signal edge is a falling edge, then the first signal is a negative pulse;
  the second encoder further comprises:
    a first oscillator configured to receive the first signal and generate a first oscillating signal with a first frequency;
    a second oscillator configured to receive the first signal and generate a second oscillating signal with a second frequency; and
    a frequency encoder configured to receive the input signal and detect the level of the input signal, wherein if the input signal is at a high level, then the frequency encoder generates the second signal according to the input signal and the first oscillating signal with the first frequency; if the input signal is at a low level, then the frequency encoder generates the second signal according to the input signal and the second oscillating signal with the second frequency.

10. The isolator according to claim 9, wherein,
  the first decoder further comprises:
    a first filter configured to receive the transmitted encoded signal and tilter a low frequency component signal off the transmitted encoded signal, wherein the low frequency component signal comprises the first oscillating signal with the first frequency and the second oscillating signal with the second frequency for generating a first filtered signal; and
    a first comparator configured to receive and compare the first filtered signal with a first predetermined level and a second predetermined level to generate the third signal, wherein if the first filtered signal is not lower than the first predetermined level, then the generated third signal is at a high level; if the first filtered signal is not greater than the second predetermined level, then the generated third signal is at a low level; if the first filtered signal is less than the first predetermined level and greater than the second predetermined level, then the generated third signal is 0;
  the second decoder further comprises:
    a second filter configured to receive the transmitted encoded signal and filter the first oscillating signal with the first frequency to generate a second filtered signal;
    a first envelope detector configured to receive the second filtered signal and to generate a first decoded signal according to the envelope of the second filtered signal;
    a third filter configured to receive the transmitted encoded signal and filter the second oscillating signal with the second frequency to generate a third filtered signal;
    a second envelope detector configured to receive the third filtered signal and to generate a second decoded signal according to the envelope of the third filtered signal; and
    a second comparator configured to receive the first decoded signal and the second decoded signal and to generate the fourth signal according to the difference of the first decoded signal and the second decoded signal.

11. The isolator according to claim 9, wherein the signal recover unit comprises:
  a multiplication circuit configured to receive the third signal and the fourth signal and multiply the third signal with the fourth signal; and
  a judgment circuit configured to generate the output signal according to a product of the third signal and the fourth signal, wherein the third signal and the fourth signal generate the output signal; if the product is greater than 0 and both the third signal and the fourth signal are greater than 0, then the generated output signal is converted to a high level; if the product is less than or equal to 0, then the generated output signal does not change its state; if the product is greater than 0 and both the third signal and the fourth signal are less than 0, then the generated output signal is converted to a low level.

12. The isolator according to claim 1, wherein,
the first encoder further comprises:
  a signal edge detector configured to detect at least one signal edge of the input signal to output an activating signal corresponding to each signal edge; and
  a pulse encoder configured to generate the first signal in response to the at least one activating signal, wherein if the at least one signal edge is a rising edge, then the first signal is a positive pulse; if the at least one signal edge is a falling edge, then the first signal is a negative pulse;
the second encoder further comprises:
  an oscillator configured to receive the first signal and generate an oscillating signal with an oscillating frequency; and
  a frequency encoder configured to receive the input signal and detect the level of the input signal, wherein if the input signal is at a high level or low level, then the frequency encoder generates the second signal according to the input signal and the oscillating signal with the oscillating frequency.

13. The isolator according to claim 12, wherein,
the first decoder further comprises:
  a first filter configured to receive the transmitted encoded signal and filter a low frequency component signal off the transmitted encoded signal, wherein the low frequency component signal comprises the oscillating signal with the oscillating frequency for generating a first filtered signal; and
  a first comparator configured to receive and compare the first filtered signal with a first predetermined level and a second predetermined level to generate the third signal, wherein if the first filtered signal is not lower than the first predetermined level, then the generated third signal is at a high level; if the first filtered signal is not greater than the second predetermined level, then the generated third signal is at a low level; if the first filtered signal is less than the first predetermined level and greater than the second predetermined level, then the generated third signal is 0;
the second decoder further comprises:
  a second filter configured to receive the transmitted encoded signal and filter the oscillating signal with the oscillating frequency to generate a second filtered signal;
  an envelope detector configured to receive the second filtered signal and to generate a decoded signal according to the envelope of the second filtered signal; and
  a second comparator configured to receive and compare the first decoding signal with a third predetermined level; if the decoded signal is not lower than the third predetermined level, then the generated fourth signal is at a high level; if the decoded signal is less than the predetermined level the third predetermined level, then the generated fourth signal is at a low level.

14. The isolator according to claim 12, wherein, the duration of the oscillating signal generated by the oscillator is not greater than the duration at which the input signal maintains at a high level or the duration at which the input signal maintains at a low level.

15. A signal generation method for an isolator, comprises:
generating a first signal by a first encoder of an input-side circuit of the isolator according to an input signal;
generating a second signal by a second encoder of the isolator according to the input signal and the first signal; and
generating an encoded signal by a signal combine unit of the isolator according to the first signal and the second signal, wherein the first signal and the second signal respectively correspond to a first portion and a second portion of the encoded signal,
wherein the first portion of the encoded signal is a pulse signal, the pulse signal is a positive pulse or a negative pulse, the positive pulse and the negative pulse indicate a signal edge of the input signal, and
the second portion is a non-amplitude encoding signal, and a central frequency of the first portion of the encoded signal is significantly hip-her than a central frequency of the second portion of the encoded signal.

16. The signal generation method according to claim 15, wherein the step of generating a first signal by a first encoder of an input-side circuit of the isolator according to an input signal comprises:
detecting one or more than one signal edge of the input signal by the first encoder of the input-side circuit; and
generating the first signal and one or more than one activating signal by the first encoder according to the one or more than one signal edge of the input signal,
wherein if the signal edge corresponding to the input signal is a rising edge and a falling edge, then the first signal is a positive pulse.

17. The signal generation method according to claim 15, wherein the step of generating a first signal by a first encoder of an input-side circuit of the isolator according to an input signal comprises:
detecting one or more than one signal edge of the input signal by the first encoder of the input-side circuit; and
generating the first signal and one or more than one activating signal by the first encoder according to the one or more than one signal edge of the input signal,
wherein if the signal edge corresponding to the input signal is a rising edge, then the first signal is a positive pulse; if the signal edge corresponding to the input signal is a falling edge, then the first signal is a negative pulse.

18. The signal generation method according to claim 16, wherein the step of generating a second signal by a second encoder of the isolator according to the input signal and the first signal comprises:
activating a first oscillator and a second oscillator of the second encoder by the one or more than one activating signal to respectively generate a first oscillating signal with a first frequency and a second oscillating signal with a second frequency;
detecting the level of the input signal by a frequency encoder of the second encoder; and
generating the second signal according to the input signal and the first oscillating signal with the first frequency if the input signal is at a high level; generating the second signal according to the input signal and the second oscillating signal with the second frequency if the input signal is at a low level.

19. The signal generation method according to claim 17, wherein the step of generating a second signal by a second encoder of the isolator according to the input signal and the first signal comprises:
activating a first oscillator and a second oscillator of the second encoder by the one or more than one activating signal to respectively generate a first oscillating signal with a first frequency and a second oscillating signal with a second frequency;
detecting the level of the input signal by a frequency encoder of the second encoder; and
generating the second signal according to the input signal and the first oscillating signal with the first frequency if the input signal is at a high level; generating the second signal according to the input signal and the second oscillating signal with the second frequency if the input signal is at a low level.

20. The signal generation method according to claim 17, wherein the step of generating a second signal by a second encoder of the isolator according to the input signal and the first signal comprises:
activating an oscillator of the second encoder by the one or more than one activating signal to generate an oscillating signal with an oscillating frequency; and
generating the second signal by a frequency encoder of the second encoder according to the input signal and the oscillating signal with the oscillating frequency.

21. The signal generation method according to claim 18, wherein the duration of the first oscillating signal generated by the first oscillator is less than or equal to the duration at which the input signal maintains at a high level, and the duration of the second oscillating signal generated by the second oscillator is less than or equal to the duration at which the input signal maintains at a low level.

22. The signal generation method according to claim 20, wherein the duration of the oscillating signal generated by the oscillator is less than or equal to the duration at which the input signal maintains at a high level, or the duration at which the input signal maintains at a low level.

* * * * *